United States Patent
Saxler

(10) Patent No.: US 9,331,192 B2
(45) Date of Patent: May 3, 2016

(54) LOW DISLOCATION DENSITY GROUP III NITRIDE LAYERS ON SILICON CARBIDE SUBSTRATES AND METHODS OF MAKING THE SAME

(75) Inventor: Adam William Saxler, Durham, NC (US)

(73) Assignee: Cree, Inc., Durham, NC (US)

( * ) Notice: Subject to any disclaimer, the term of this patent is extended or adjusted under 35 U.S.C. 154(b) by 219 days.

(21) Appl. No.: 11/169,471

(22) Filed: Jun. 29, 2005

(65) Prior Publication Data
US 2007/0004184 A1 Jan. 4, 2007

(51) Int. Cl.
| H01L 29/66 | (2006.01) |
| H01L 29/778 | (2006.01) |
| H01L 29/16 | (2006.01) |
| H01L 29/20 | (2006.01) |

(52) U.S. Cl.
CPC ......... H01L 29/7787 (2013.01); *H01L 29/1608* (2013.01); *H01L 29/2003* (2013.01)

(58) Field of Classification Search
CPC ............ H01L 29/2003; H01L 29/7787
USPC .......... 257/E33.025, E33.034, E33.028, 257/E33.03, E33.033, 194, 192, 12, 190, 257/613, 615
See application file for complete search history.

(56) References Cited

U.S. PATENT DOCUMENTS

| 4,424,525 A | 1/1984 | Mimura |
| 4,471,366 A | 9/1984 | Delagebeaudeuf et al. |
| 4,716,130 A | 12/1987 | Johnston, Jr. et al. |
| 4,727,403 A | 2/1988 | Hilda et al. |
| 4,755,867 A | 7/1988 | Cheng |
| 4,788,156 A | 11/1988 | Stoneham et al. |
| 4,946,547 A | 8/1990 | Palmour et al. |
| 5,053,348 A | 10/1991 | Mishra et al. |
| 5,172,197 A | 12/1992 | Nguyen et al. |
| 5,192,987 A | 3/1993 | Khan et al. |
| 5,200,022 A | 4/1993 | Kong et al. |
| 5,210,051 A | 5/1993 | Carter, Jr. |
| 5,296,395 A | 3/1994 | Khan et al. |
| 5,298,445 A | 3/1994 | Asano |
| 5,362,678 A | 11/1994 | Komaru et al. |
| RE34,861 E | 2/1995 | Davis et al. |
| 5,389,571 A | 2/1995 | Takeuchi et al. |
| 5,393,993 A | 2/1995 | Edmond et al. |
| 5,523,589 A | 6/1996 | Edmond et al. |

(Continued)

FOREIGN PATENT DOCUMENTS

| EP | 0 334 006 | 9/1989 |
| EP | 0 563 847 | 10/1993 |

(Continued)

OTHER PUBLICATIONS

Heikman et al., "Growth of Fe doped semi-insulating GaN by metalorganic chemical vapor deposition", Applied Physics Letters 81 (2002) pp. 439-441.*

(Continued)

*Primary Examiner* — Jay C Kim
(74) *Attorney, Agent, or Firm* — Anthony J. Josephson

(57) ABSTRACT

Group III nitride semiconductor device structures are provided that include a silicon carbide (SiC) substrate and a Group III nitride epitaxial layer above the SiC substrate. The Group III nitride epitaxial layer has a dislocation density of less than about $4 \times 10^8$ cm$^{-2}$ and/or an isolation voltage of at least about 50V.

57 Claims, 4 Drawing Sheets

(56) References Cited

U.S. PATENT DOCUMENTS

| | | |
|---|---|---|
| 5,534,462 A | 7/1996 | Fiordalice et al. |
| 5,592,501 A | 1/1997 | Edmond et al. |
| 5,656,538 A | 8/1997 | Gardner et al. |
| 5,686,737 A | 11/1997 | Allen |
| 5,700,714 A | 12/1997 | Ogilhara et al. |
| 5,701,019 A | 12/1997 | Matsumoto et al. |
| 5,705,827 A | 1/1998 | Baba et al. |
| 5,804,482 A | 9/1998 | Konstantinov et al. |
| 5,885,860 A | 3/1999 | Weitzel et al. |
| 5,946,547 A | 8/1999 | Kim et al. |
| 5,990,531 A | 11/1999 | Taskar et al. |
| 6,019,840 A | 2/2000 | Hartmann et al. |
| 6,028,328 A | 2/2000 | Riechert et al. |
| 6,046,464 A | 4/2000 | Schetzina |
| 6,051,849 A | 4/2000 | Davis et al. |
| 6,064,082 A | 5/2000 | Kawai et al. |
| 6,086,673 A | 7/2000 | Molnar |
| 6,150,680 A | 11/2000 | Eastman et al. |
| 6,177,685 B1 | 1/2001 | Teraguchi et al. |
| 6,177,688 B1 | 1/2001 | Linthicum et al. |
| 6,211,539 B1 | 4/2001 | Johnston, Jr. et al. |
| 6,218,680 B1 | 4/2001 | Carter, Jr. et al. |
| 6,255,198 B1 | 7/2001 | Linthicum et al. |
| 6,261,929 B1 | 7/2001 | Gehrke et al. |
| 6,316,793 B1 | 11/2001 | Sheppard et al. |
| 6,376,339 B2 | 4/2002 | Linthicum et al. |
| 6,380,108 B1 | 4/2002 | Linthicum et al. |
| 6,396,085 B1 | 5/2002 | Yoshida |
| 6,429,467 B1 | 8/2002 | Ando |
| 6,448,648 B1 | 9/2002 | Boos |
| 6,462,355 B1 | 10/2002 | Linthicum et al. |
| 6,476,431 B1 | 11/2002 | Ohno et al. |
| 6,486,042 B2 | 11/2002 | Gehrke et al. |
| 6,489,221 B2 | 12/2002 | Gehrke et al. |
| 6,492,669 B2 | 12/2002 | Nakayama et al. |
| 6,515,316 B1 | 2/2003 | Wojtowicz et al. |
| 6,521,514 B1 | 2/2003 | Gehrke et al. |
| 6,545,300 B2 | 4/2003 | Gehrke et al. |
| 6,548,333 B2 | 4/2003 | Smith |
| 6,570,192 B1 | 5/2003 | Davis et al. |
| 6,582,906 B1 | 6/2003 | Cao et al. |
| 6,582,986 B2 | 6/2003 | Kong et al. |
| 6,586,778 B2 | 7/2003 | Linthicum et al. |
| 6,586,781 B2 | 7/2003 | Wu et al. |
| 6,602,763 B2 | 8/2003 | Davis et al. |
| 6,602,764 B2 | 8/2003 | Linthicum et al. |
| 6,608,327 B1 | 8/2003 | Davis et al. |
| 6,611,002 B2 | 8/2003 | Weeks et al. |
| 6,621,148 B2 | 9/2003 | Linthicum et al. |
| 6,639,255 B2 | 10/2003 | Inoue et al. |
| 6,673,702 B2 | 1/2004 | Orita et al. |
| 6,686,261 B2 | 2/2004 | Gehrke et al. |
| 6,706,114 B2 | 3/2004 | Mueller |
| 6,765,240 B2 | 7/2004 | Tischler et al. |
| 6,841,001 B2 | 1/2005 | Saxler |
| 6,849,882 B2 | 2/2005 | Chavarkar et al. |
| 6,958,497 B2 | 10/2005 | Emerson et al. |
| 6,982,204 B2 | 1/2006 | Saxler et al. |
| 6,989,287 B2 | 1/2006 | Fujikura et al. |
| 7,014,710 B2 | 3/2006 | Fang et al. |
| 7,033,912 B2 | 4/2006 | Saxler |
| 7,045,404 B2 | 5/2006 | Sheppard et al. |
| 7,084,441 B2 | 8/2006 | Saxler |
| 7,135,715 B2 | 11/2006 | Saxler |
| 7,161,194 B2 | 1/2007 | Parikh et al. |
| 7,170,111 B2 | 1/2007 | Saxler |
| 7,233,028 B2 | 6/2007 | Weeks et al. |
| 7,238,560 B2 | 7/2007 | Sheppard et al. |
| 7,312,474 B2 | 12/2007 | Emerson et al. |
| 7,332,795 B2 | 2/2008 | Smith et al. |
| 7,355,215 B2 | 4/2008 | Parikh et al. |
| 7,626,217 B2 * | 12/2009 | Saxler ............ 257/194 |
| 2001/0015446 A1 | 8/2001 | Inoue et al. |
| 2001/0020700 A1 | 9/2001 | Inoue et al. |
| 2001/0023964 A1 | 9/2001 | Wu et al. |
| 2001/0040246 A1 | 11/2001 | Ishii |
| 2002/0008241 A1 | 1/2002 | Edmond et al. |
| 2002/0017648 A1 | 2/2002 | Kasahara et al. |
| 2002/0017696 A1 | 2/2002 | Nakayama et al. |
| 2002/0066908 A1 | 6/2002 | Smith |
| 2002/0079508 A1 | 6/2002 | Yoshida |
| 2002/0119610 A1 | 8/2002 | Nishii et al. |
| 2002/0125506 A1 | 9/2002 | Yoshida et al. |
| 2002/0166502 A1* | 11/2002 | Vaudo et al. ............ 117/89 |
| 2002/0167023 A1* | 11/2002 | Chavarkar et al. ............ 257/194 |
| 2003/0017683 A1 | 1/2003 | Emrick et al. |
| 2003/0020092 A1 | 1/2003 | Parikh et al. |
| 2003/0102482 A1 | 6/2003 | Saxler |
| 2003/0123829 A1 | 7/2003 | Taylor |
| 2003/0145784 A1 | 8/2003 | Thompson et al. |
| 2003/0157776 A1 | 8/2003 | Smith |
| 2003/0213975 A1 | 11/2003 | Hirose et al. |
| 2003/0235970 A1 | 12/2003 | Hsu et al. |
| 2004/0004223 A1 | 1/2004 | Nagahama et al. |
| 2004/0021152 A1 | 2/2004 | Nguyen et al. |
| 2004/0029330 A1 | 2/2004 | Hussain et al. |
| 2004/0061129 A1 | 4/2004 | Saxler et al. |
| 2004/0124435 A1 | 7/2004 | D'Evelyn et al. |
| 2004/0149993 A1 | 8/2004 | McClure et al. |
| 2004/0241970 A1 | 12/2004 | Ring |
| 2005/0001235 A1 | 1/2005 | Murata et al. |
| 2005/0009310 A1* | 1/2005 | Vaudo et al. ............ 438/543 |
| 2005/0029526 A1 | 2/2005 | McClure et al. |
| 2005/0087753 A1 | 4/2005 | D'Evelyn et al. |
| 2005/0258451 A1 | 11/2005 | Saxler et al. |
| 2006/0017064 A1 | 1/2006 | Saxler et al. |
| 2006/0099781 A1 | 5/2006 | Beaumont et al. |
| 2006/0108606 A1 | 5/2006 | Saxler et al. |
| 2006/0208280 A1 | 9/2006 | Smith et al. |
| 2006/0226412 A1 | 10/2006 | Saxler et al. |
| 2006/0226413 A1 | 10/2006 | Saxler |
| 2006/0244010 A1 | 11/2006 | Saxler |
| 2006/0244011 A1 | 11/2006 | Saxler |
| 2007/0004184 A1 | 1/2007 | Saxler |

FOREIGN PATENT DOCUMENTS

| | | |
|---|---|---|
| EP | 1 263 029 | 12/2002 |
| EP | 1 492 158 | 12/2004 |
| JP | 10-050982 | 2/1998 |
| JP | 11261053 | 9/1999 |
| JP | 2001230407 | 8/2001 |
| JP | 2002016087 | 1/2002 |
| JP | 2002299622 A | 10/2002 |
| JP | 2004-342810 | 12/2004 |
| JP | 2005-019872 A | 1/2005 |
| TW | 488082 B | 5/2002 |
| TW | 530327 B | 5/2003 |
| TW | 544952 B | 8/2003 |
| TW | 574762 B | 2/2004 |
| WO | WO 93/23877 | 11/1993 |
| WO | 01/27980 A1 | 4/2001 |
| WO | WO 01/57929 | 8/2001 |
| WO | WO 03/049193 | 6/2003 |
| WO | WO 2004/008495 | 1/2004 |
| WO | WO 2004/061923 | 7/2004 |
| WO | WO 2004/097941 | 11/2004 |
| WO | 2005/008738 A2 | 1/2005 |
| WO | 2005008738 A2 | 1/2005 |
| WO | 2007005074 A1 | 1/2007 |

OTHER PUBLICATIONS

Heikman et al., "Growth and characteristics of Fe-doped GaN", Journal of Crystal Growth 248 (2003) pp. 513-517.*

Polyakov et al., "Influence of high-temperature annealing on the properties of Fe doped semi-insulating GaN structures", Journal of Applied Physics 95 (2004) pp. 5591-5596.*

Smart et al.;AlGaN/GaN heterostructures on insulating AlGaN nucleation layers;Applied Physics Letters; vol. 75, No. 3;Jul. 19, 1999;School of Elec. Engg. Cornell Univ, NY14850.

Bougrioua et al., "Some benefits of Fe dopod less disloced GaN templates for AlGaN/GaN HEMTs grown by MOVPE," 2005, pp.

(56) References Cited

OTHER PUBLICATIONS 536-644, vol. 202, No. 4, Physica Status Solidi Wiley-VCH Verlag GmbH & Co., Germany.
International Search Report for International Application No. PCT/US2006/010482, mailed Aug. 3, 2006.
Ambacher et al., "Two Dimensional Electron Gases Induced by Spontaneous and Piezoelectric Polarization Charges in N- and Ga-face AlGaN/GaN Heterostructures," Journal of Applied Physics, vol. 85, No. 6, pp. 3222-3233 (Mar. 1999).
Ando et al., "10-W/mm AlGaN-GaN HFET With a Field Modulating Plate," IEEE Electron Device Letters, 24(5), pp. 289-291 (May 2003).
Asbeck et al., "Piezoelectric charge densities in AlGaN/GaN HFETs," Electronics Letters. vol. 33, No. 14, pp. 1230-1231 (1997).
Beaumont, B. et al., "Epitaxial Lateral Overgrowth of GaN," Phys. Stat. Sol. (b) 227, No. 1, pp. 1-43 (2001).
Ben-Yaacov et al., "AlGaN/GaN Current Aperture Vertical Electron Transistors with Regrown Channels," Journal of Applied Physics. vol. 95, No. 4, pp. 2073-2078 (2004).
Breitschadel et al., "Minimization of Leakage Current of Recessed Gate AlGaN/GaN HEMTs by Optimizing the Dry-Etching Process," Journal of Electronic Materials, vol. 28, No. 12, pp. 1420-1423 (1999).
Burm et al., "Recessed Gate GaN MODFETS," Solid-State Electronics, vol. 41, No. 2, pp. 247-250 (1997).
Burm et al., "Ultra-Low Resistive Ohmic Contacts on n-GaN Using Si Implantation," Applied Physics Letters, vol. 70, No. 4, 464-66 (1997).
Chang et al., "AlGaN/GaN Modulation-Doped Field-Effect Transistors with an Mg-doped Carrier Confinement Layer," Jpn. J. Appl. Phys., 42:3316-3319 (2003).
Chen et al.,"$Cl_2$ reactive ion etching for gate recessing of AlGaN/GaN field-effect transistors," J. Vac. Sci. Technol. B. vol. 17, No. 6, pp. 2755-2758 (1999).
Chini et al., "Power and Linearity Characteristics of Field-Plated Recessed-Gate AlGaN-GaN HEMTs," IEEE Electron Device Letters, 25(5), pp. 229-231 (May 2004).
Cho et al., "A New GaAs Field Effect Transistor (FET) with Dipole Barrier (DIB)," Jpn. J. Appl. Phys. 33:775-778 (1994).
Coffie et al., Unpassivated p-GaN/AlGaN/GaN HEMTs with 7.1 W/mmF at 10 GHz, Electronic Letters online No. 20030872, 39(19) (Sep. 18, 2003).
Eastman et al., "GaN materials for high power microwave amplifiers," Mat. Res. Soc. Symp. Proc., vol. 512 (1998).
Eastman et al., "Undoped AlGaN/GaN HEMTs for Microwave Power Amplification," IEEE Transactions on Electron Devices, vol. 48, No. 3, pp. 479-485 (Mar. 2001).
Egawa et al., "Recessed gate AlGaN/GaN MODFET on Sapphire Grown by MOCVD," Applied Physics Letters, vol. 76, No. 1, pp. 121-123 (Jan. 2000).
Gaska et al., "Electron Transport in AlGaN/GaN Heterostructures Grown on 6H-SiC Substrates," Applied Physics Letters, vol. 72, No. 6, pp. 707-709 (Feb. 1998).
Gaska et al., "High-Temperature Performance of AlGaN/GaN HFETs on SiC Substrates," IEEE Electron Device Letters, vol. 18, No. 1, pp. 492-494 (Oct. 1997).
Gaska et al., "Self-Heating in High-Power AlGaN/GaN HFETs," IEEE Electron Device Letters, 19(3), pp. 89-91 (Mar. 1998).
Gelmont et al., "Monte Carlo simulation of electron transport in gallium nitride," Journal of Applied Physics, vol. 74, No. 3, pp. 1818-1821 (Aug. 1993).
Heikman et al., "Growth of Fe-Doped Semi-insulating GaN by Metalorganic Chemical Vapor Deposition," Applied Physics Letters, vol. 83, No. 1, pp. 439-441 (Jul. 2002).
Heikman, et al., "Mass Transport Regrowth of GaN for Ohmic Contacts to AlGaN/GaN," Applied Physics Letters, vol. 78, No. 19, pp. 2876.
Heikman et al., "Polarization Effects in AlGaN/GaN and GaN/AlGaN/GaN heterostructures," Journal of Applied Physics, vol. 93, No. 12, pp. 10114-10118 (Jun. 2003).

Heikman, Sten J., MOCVD Growth Technologies for Applications in AlGaN/GaN High Electron Mobility Transistors, Dissertation, University of California—Santa Barbara, Sep. 2002, 190 pages.
Hikita et al., "350V/150A AlGaN/GaN Power HFET on Silicon Substrate With Source—via Grouding (SVG) Structure," Electron Devices Meeting, 2004, pp. 803-806, IEDM Technical Digest, IEEE International (Dec. 2004).
Kanaev et al., "Femtosecond and Ultraviolet Laser Irradiation of Graphitelike Hexagonal Boron Nitride," Journal of Applied Physics, 96(8), pp. 4483-4489 (Oct. 15, 2004).
Kanamura et al., "A 100-W High-Gain AlGaN/GaN HEMT Power Amplifier on a Conductive N-SiC Substrate for Wireless Base Station Applications," Electron Devices Meeting, 2004, pp. 799-802, IEDM Technical Digest, IEEE International (Dec. 2004).
Karmalkar et al., "Enhancement of Breakdown Voltage in AlGaN/GaN High Electron Mobiity Transistors Using a Field Plate," IEEE Transactions on Electron Devices, vol. 48, No. 8, pp. 1515-1521 (Aug. 2001).
Karmalkar et al., "RESURF AlGaN/GaN HEMT for High Voltage Power Switching," IEEE Electron Device Letters, vol. 22, No. 8, pp. 373-375 (Aug. 2001).
Karmalkar et al., "Very High Voltage AlGaN/GaN High Electron Mobility Transistors Using a Field Plate Deposited on a Stepped Insulator," Solid State Electronics, vol. 45, pp. 1645-1652 (2001).
Kasahara et al., "Ka-band 2.3W Power AlGaN/GaN Heterojunction FET," IEDM Technical Digest, pp. 677-680 (2002).
Komiak et al., "Fully Monolithic 4 Watt High Efficiency Ka-band Power Amplifier," IEEE MTT-S International Microwave Symposium Digest, vol. 3, pp. 947-950 (1999).
Kusters et al., "Double-Heterojunction Lattice-Matched and Pseudomorphic InGaAs HEMT with δ-Doped InP Supply Layers and p-InP Barrier Enchancement Layer Grown by LP-MOVPE," IEEE Electron Device Letters, 14(1), (Jan. 1993).
Kuzmik et al., "Annealing of Schottky contacts deposited on dry etched AlGaN/GaN," Semiconductor Science and Technology, vol. 17, No. 11 (Nov. 2002).
Manfra et al., "Electron Mobility Exceeding 160 000 $cm^2$/Vs in AlGaN/GaN Heterostructures Grown by Molecular-beam Epitaxy," Applied Physics Letters, 85(22), pp. 5394-5396 (Nov. 29, 2004).
Manfra et al., "High Mobility AlGaN/GaN Heterostructures Grown by Plasma-assisted Molecular beam Epitaxy on Semi-Insulating GaN Templates Prepared by Hydride Vapor Phase Epitaxy," Journal of Applied Physics, 92(1), pp. 338-345 (Jul. 1, 2002).
Manfra et al., "High-Mobility AlGaN/GaN Heterostructures Grown by Molecular-beam Epitaxy on GaN Templates Prepared by Hydride Vapor Phase Epitaxy," Applied Physics Letters, 77(18), pp. 2888-2890 (Oct. 30, 2000).
Neuburger et al., "Design of GaN-based Field Effect Transistor Structures based on Doping Screening of Polarization Fields," WA 1.5, 7th Wide-Bandgap III-Nitride Workshop (Mar. 2002).
Parikh et al., "Development of Gallium Nitride Epitaxy and Associated Material-Device Correlation for RF, Microwave and MM-wave Applications," Cree, Inc. (35 slides).
Ping et al., "DC and Microwave Performance of High-Current AlGaN/GaN Heterostructure Field Effect Transistors Grown on p-Type SiC Substrates," IEEE Electron Device Letters, vol. 19, No. 2, pp. 54-56 (Feb. 1998).
Saxler et al., "III-Nitride Heterostructures on High-Purity Semi-Insulating 4H-SiC Substrates for High-Power RF Transistors," International Workshop on Nitride Semiconductors (Jul. 19, 2004).
Sheppard et al., "High Power Demonstration at 10 GHz with GaN/AlGaN HEMT Hybrid Amplifiers," Presented at the 58th DRC, Denver, CO, Jun. 2000.
Sheppard et al., "Improved 10-GHz Operation of GaN/AlGaN HEMTs on Silicon Carbide," Materials Science Forum, vols. 338-342, pp. 1643-1646 (2000).
Shen et al., "High-Power Polarization-Engineered GaN/AlGaN/GaN HEMTs Without Surface Passivation," IEEE Electronics Device Letters, vol. 25, No. 1, pp. 7-9, (2004).
Shiojima et al., "Improved Carrier Confinement by a Buried p-Layer in the AlGaN/GaN HEMT Structure," IEICE Trans. Electron., E83-(12) (Dec. 2000).

(56) References Cited

OTHER PUBLICATIONS

Sriam et al., "RF Performance of AlGaN/GaN MODFETs on High Resistivity SiC Substrates," Presentation at Materials Research Society Fall Symposium (1997).
Sriam et al., "SiC and GaN Wide Bandgap Microwave Power Transistors," IEEE Sarnoff Symposium, Pittsburgh, PA (Mar. 18, 1998).
Sullivan et al., "High-Power 10-GHz Operation of AlGaN HFETs on Insulating SiC," IEEE Electron Device Letters, vol. 19, No. 6 pp. 198-200 (Jun. 1998).
"Thick AlN template on SiC Substrate—Novel semi insulating substrate for GaN-based devices," © 2003 by TDI, Inc., http://www.tdii.com/products/AlN_SiCt.html.
Tilak et al., "Influence of Barrier Thickness on the High-Power Performance of AlGaN/GaN HEMTs," IEEE Electron Device Letters, 22(11), pp. 504-506 (Nov. 2001).
Vaudo et al., "GaN Boule Growth: A Pathway to GaN Wafers With Improved Material Quality," ATMI, Inc. (2003).
Walker, J.L.B. (Ed.), High Power GaAs FET Amplifiers, Norwood, MA: Artech House, pp. 119-120 (1993).
Wu et al., "3.5-Watt AlGaN/GaN HEMTs and Amplifiers at 35 GHz,"IEDM-2003, Cree, Inc.
Wu et al., 3.5-Watt AlGaN/GaN/GaN HEMTs and Amplifiers at 35 GHz, Cree Santa Barbara Technology Center, Goleta, CA 93117.
Wu et al., "30-W/mm GaN HEMTs by Field Plate Optimization," IEEE Electron Device Letters, 25(3), pp. 117-119 (Mar. 2004).
Wu et al, "Bias-dependent Performance of High-Power AlGaN/GaN HEMTs," IEDM Technical Digest, pp. 378-380 (2001).
Wu et al., "High Al-Content AlGaN/GaN MODFETs for Ultrahigh Performance," IEEE Electron Device Letters, vol. 19, No. 2, pp. 50-53 (Feb. 1998).
Wu et al., "Linearity Performance of GaN HEMTs With Field Plates," DRC 2004, Cree, Inc.
Wu et al., "Linearity Performance of GaN HEMTs With Field Plates," Cree Santa Barbara Technology Center, Goleta, CA 93117.
Xu et al., "Growth and Characteristics of Freestanding Gallium Nitride Substrates," ATMI, Inc. (2003).
Yu et al., Schottky Barrier Engineering in III-V Nitrides via the Piezoelectric Effect, Applied Physics Letters, 73(13), pp. 1880-1882 (Sep. 28, 1998).
Zhang et al., "High Breakdown GaN HEMT with Overlapping Gate Structure," IEEE Electron Device Letters, 21(9), pp. 421-423 (Sep. 2000).
International Search Report and The Written Opinion of the International Searching Authority corresponding to PCT/US2006/004352, mailed May 31, 2006.
International Search Report and The Written Opinion of the International Searching Authority corresponding to International Application No. PCT/US2006/004353, mailed Dec. 4, 2006.
Annex to form PCT/ISA/206 Communication Relating to the Results of the Partial International Search for PCT/US2006/004353, mailed Sep. 22, 2006.
Rawn et al., Lattice Parameters of Gallium Nitride at High Temperatures and Resulting Epitaxial Misfits With Alumina and Silicon Carbide, JCPDS—International Centre for Diffraction Data 2000, Advances in X-ray Analysis, vol. 43, pp. 338-343.
Addendum to Cite No. 182: Saxler et al., "III-Nitride Heterostructures on High-Purity Semi-Insulating 4H-SiC Substrates for High-Power RF Transistors," International Workshop on Nitride Semiconductors (Jul. 19, 2004).
Office Action in commonly owned copending U.S. Appl. No. 11/103,117, dated Nov. 16, 2007.
Office Action in commonly owned copending U.S. Appl. No. 11/103,127, dated May 29, 2007.
Office Action in commonly owned copending U.S. Appl. No. 11/103,127, dated Nov. 13, 2007.
Office Action in commonly owned copending U.S. Appl. No. 11/103,127, dated Mar. 31, 2008.
Taiwanese Office Action in counterpart Taiwanese Application No. 095112148, dated Oct. 27, 2009.
English translation of Taiwanese Office Action in counterpart Taiwanese Application No. 095112148, dated Oct. 27, 2009.
Office Action for Taiwanese patent application 095112148 mailed Jul. 5, 2012, 5 pages.
H. Witte et al, "Deep Defects in Fe-Doped GaN Layers Analysed by Electrical and Photoelectrical Spectroscopic Methods," uGaN and Related Alloys—2003 Symposium, Dec. 1-5, 2003, Materials Research Society Symposium Proceedings, 2004, vol. 298, pp. 575-580.
Official Action for Japanese Application No. 2008-519264 issued Feb. 3, 2012, 13 pages.
Written Examination for Japanese Patent Application No. 2008-519264, mailed May 14, 2013, 4 pages.
Decision on Appeal for Japanese Patent Application No. 2008-519264, issued Apr. 22, 2014, 32 pages (with English translation).
Office Action for Taiwanese Patent Application No. 102100601, mailed Jun. 11, 2014, 7 pages.
Examination Report for European Patent Application No. 06 739 327.2, mailed Nov. 21, 2014, 8 pages.

\* cited by examiner

LOW DISLOCATION DENSITY GROUP III NITRIDE LAYERS ON SILICON CARBIDE SUBSTRATES AND METHODS OF MAKING THE SAME

The present invention relates to semiconductor devices and, more particularly, to Group III-nitride semiconductor devices. This invention was partially funded under Government Contract No. N00014-02-C-0306. The Government may have certain rights in this invention.

BACKGROUND OF THE INVENTION

Materials such as silicon (Si) and gallium arsenide (GaAs) have found wide application in semiconductor devices. These materials, however, may not be well suited for higher power and higher frequency applications because of their relatively small bandgaps (e.g., 1.12 eV for Si and 1.42 eV for GaAs at room temperature) and/or relatively small breakdown voltages.

In view of increased interest in high power and high frequency applications and devices, attention has turned to wide bandgap semiconductor materials such as the Group III nitrides, including gallium nitride (GaN, with a bandgap of 3.4 eV at room temperature). GaN also exhibits high breakdown fields of about 3 MV/cm, thus enabling such materials to withstand high power levels. In addition, GaN exhibits excellent electron-transport properties, which enables it to operate at high frequencies.

A device of particular interest for high power and/or high frequency applications is the High Electron Mobility Transistor (HEMT), which, in certain cases, is also known as a modulation doped field effect transistor (MODFET). These devices may offer operational advantages under a number of circumstances because a thin layer of charge carriers, referred to as a two-dimensional electron gas (2DEG), can form at the heterojunction of two semiconductor materials with different bandgap energies and electron affinities. The 2DEG can contain a very high sheet electron concentration in excess of, for example, $10^{13}$ carriers/cm$^2$.

Homoepitaxial growth of Group III nitride based HEMTs on GaN substrates has typically focused on the use of semi-insulating GaN substrates. The lack of suitable GaN substrates, however, can make the growth of device quality heterostructures in this material system difficult.

Recent efforts have focused on the fabrication of Group III nitride type HEMTs using heteroepitaxial growth on substrates such as silicon carbide (SiC). The production of Group III nitride epitaxial layers (such as GaN layers) on silicon carbide substrates, however, can also be problematic. Relatively thin GaN epitaxial layers can exhibit electrical properties useful in various applications, including HEMTs. Thin GaN layers, however, can have unacceptably high dislocation densities, thereby rendering the structures unsuitable for many such applications.

Increasing the thickness of the GaN epitaxial layer can reduce dislocation density but to the detriment of other properties of the material. The increased thickness of the GaN epitaxial layer can, for example, adversely affect the electrical properties of the material, and in particular, can decrease the isolation and breakdown voltage of the material. In addition, GaN and SiC have different unstrained lattice constants (3.19 Å and 3.07 Å, respectively). The strain resulting from unmatched lattice constants can limit GaN epitaxial thickness and wafer diameter before the wafer cracks and/or bows, thereby rendering the GaN material unsuitable for downstream processing.

BRIEF SUMMARY OF THE INVENTION

The present invention provides Group III nitride semiconductor device structures that can be useful in the production of Group III nitride transistors, including high electron mobility transistors (HEMTs). The semiconductor device structure of the invention includes a silicon carbide (SiC) substrate and a first Group III nitride epitaxial layer above the SiC substrate. The Group III nitride epitaxial layer can exhibit a variety of useful, yet often contradictory, physical and electrical properties, including a dislocation density of less than about $4\times10^8$ cm$^{-2}$ and/or an isolation voltage of at least about 50 V.

In exemplary embodiments of the invention, the Group III nitride epitaxial layer can have a thickness sufficient to reduce the dislocation density of the layer to a level that is acceptable for various downstream applications. In these various embodiments, the Group III nitride epitaxial layer can have a thickness of at least about 5 microns. In other embodiments of the invention, the Group III nitride epitaxial layer can have a thickness of at least about 6 microns, at least about 8 microns, at least about 10 microns, and at least about 20 microns.

The Group III nitride epitaxial layer can further include a deep level dopant, such as a deep level transition metal dopant, in an amount sufficient to impart electrical properties to the layer that approximate the electrical properties of a layer of the same material but with reduced thickness, such as isolation voltage. Exemplary transition metal dopants include without limitation iron (Fe), cobalt (Co), manganese (Mn), chromium (Cr), vanadium (V), nickel (Ni), and mixtures thereof. The Group III nitride epitaxial layer can further include a co-dopant, such as a shallow level p-type dopant.

The present invention further includes semiconductor device structures that include the SiC substrate and the first Group III nitride epitaxial layer in combination with at least a second Group III nitride epitaxial layer on the first Group III nitride layer. In this aspect of the invention, the second Group III nitride epitaxial layer has a composition sufficiently different from the first Group III nitride layer to generate a two dimensional electron gas at the interface between the first and second Group III nitride layers. The semiconductor device structure can further include one or more additional Group III nitride epitaxial layers above the second Group III nitride layer to further increase the electron mobility in the two dimensional electron gas.

The semiconductor device structure of the invention can further include a nucleation layer disposed between the SiC substrate and the first Group III nitride epitaxial layer. The nucleation layer can provide an appropriate growth transition between the SiC substrate and the remainder of the structure and can be formed of various suitable semiconductor materials, including without limitation aluminum gallium nitride (AlGaN) and aluminum nitride (AlN).

The semiconductor device of the invention can further include a strain management layer, which can also be disposed between the SiC substrate and the first Group III nitride epitaxial layer. The presence of a strain management layer can facilitate the fabrication of relatively thick Group III nitride epitaxial layers and/or relatively large diameter wafers (up to 100 mm in diameter) without substantial cracking of the epitaxial layers and/or bowing of the wafer. Device fabrication conditions can also be controlled to control the strain in the layer, for example, by increasing the V/III precursor ratio and/or by decreasing the pressure under which the Group III nitride epitaxial layer is fabricated.

The present invention also provides methods for the fabrication of a semiconductor device structure that includes the step of forming a first Group III nitride epitaxial layer having a dislocation density of less than about $4 \times 10^8$ cm$^{-2}$ and/or an isolation voltage of at least about 50V on a SiC substrate. This aspect of the invention can include the step of forming the Group III nitride epitaxial layer having a thickness sufficient to provide the desired dislocation density, for example, a thickness of at least about 5 microns. In other embodiments of the invention, the Group III nitride epitaxial layer can have a thickness of at least about 6 microns, at least about 8 microns, at least about 10 microns, and at least about 20 microns. The method of the invention can further include the step of introducing gaseous Group III nitride precursors and a transition metal dopant precursor into a reaction chamber in an amount sufficient to increase the isolation voltage of the Group III nitride epitaxial layer as compared to a Group III nitride epitaxial layer of the same thickness without a transition metal dopant.

The method of the invention can further include the step of forming a heterostructure that includes the first Group III nitride epitaxial layer and a second Group III nitride epitaxial layer on the first Group III nitride layer having a composition sufficiently different from the first Group III nitride layer to generate a two dimensional electron gas at the interface between the first and second Group III nitride layers. The various embodiments of the invention can further include the step of forming a plurality of gate, source and drain contacts in conductive relationship to the heterostructure.

BRIEF DESCRIPTION OF THE DRAWINGS

Figure 1:
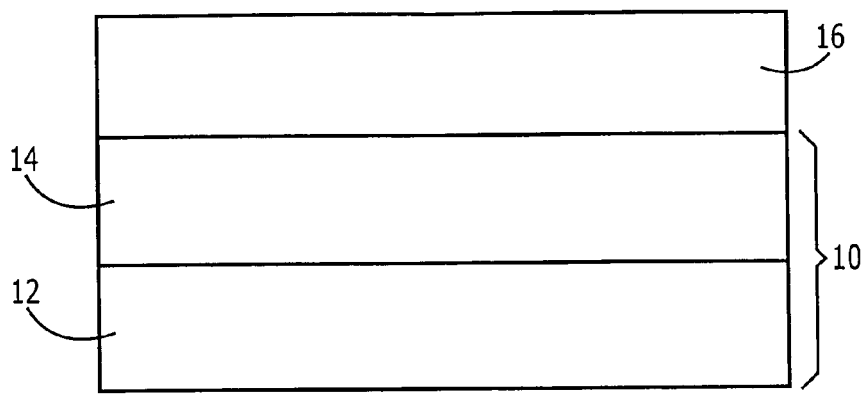
Figure 2:
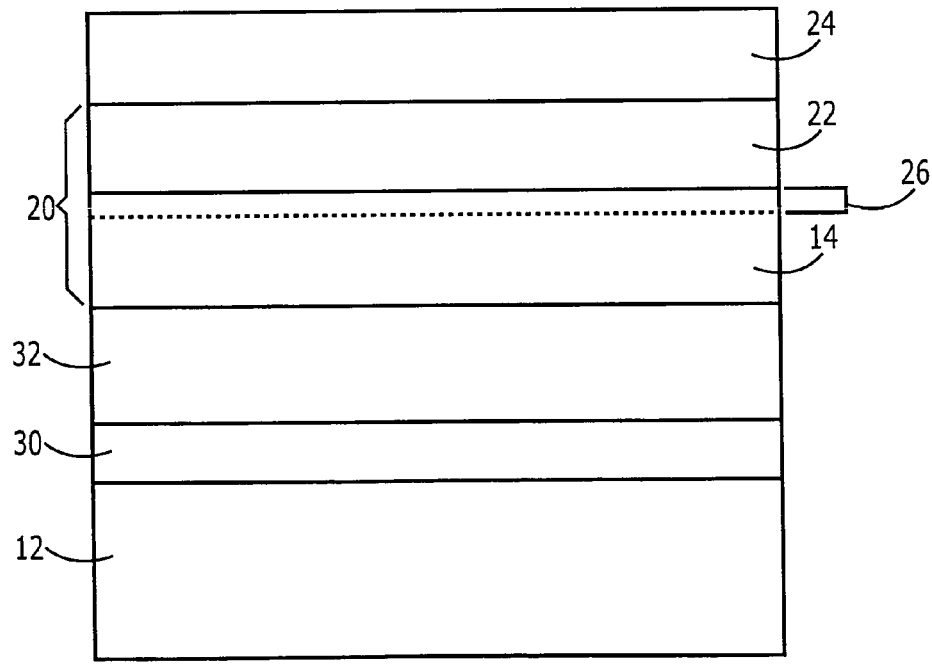
Figure 3:
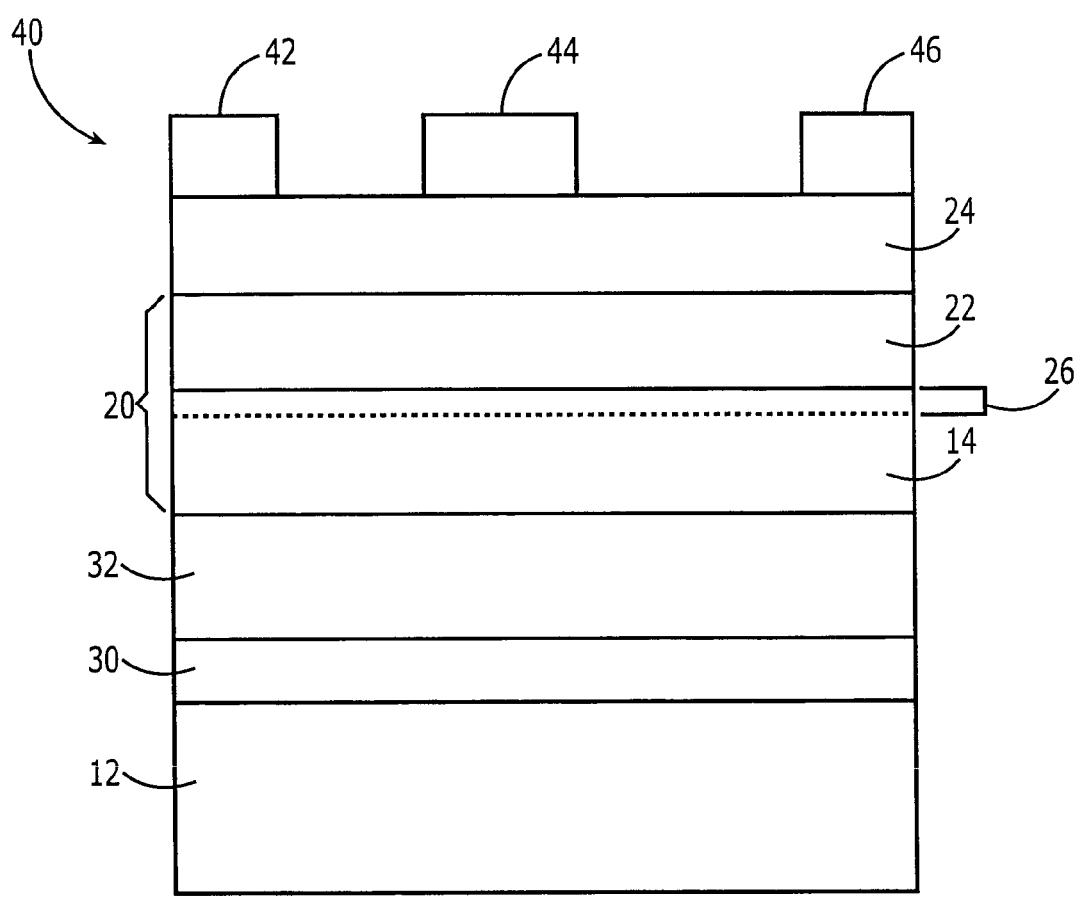
Figure 4:
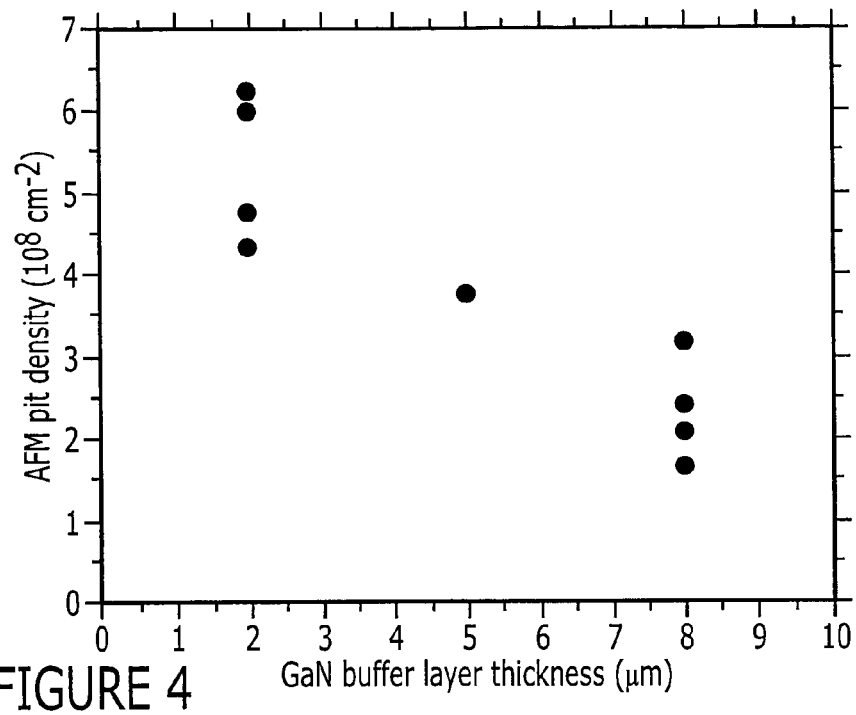
Figure 5:
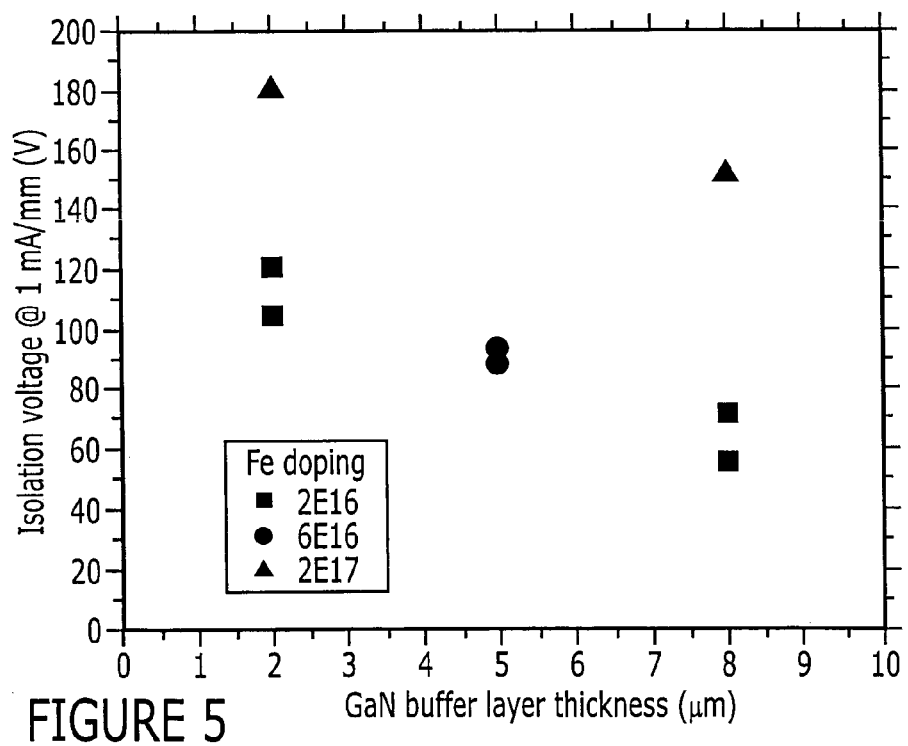
Figure 6:
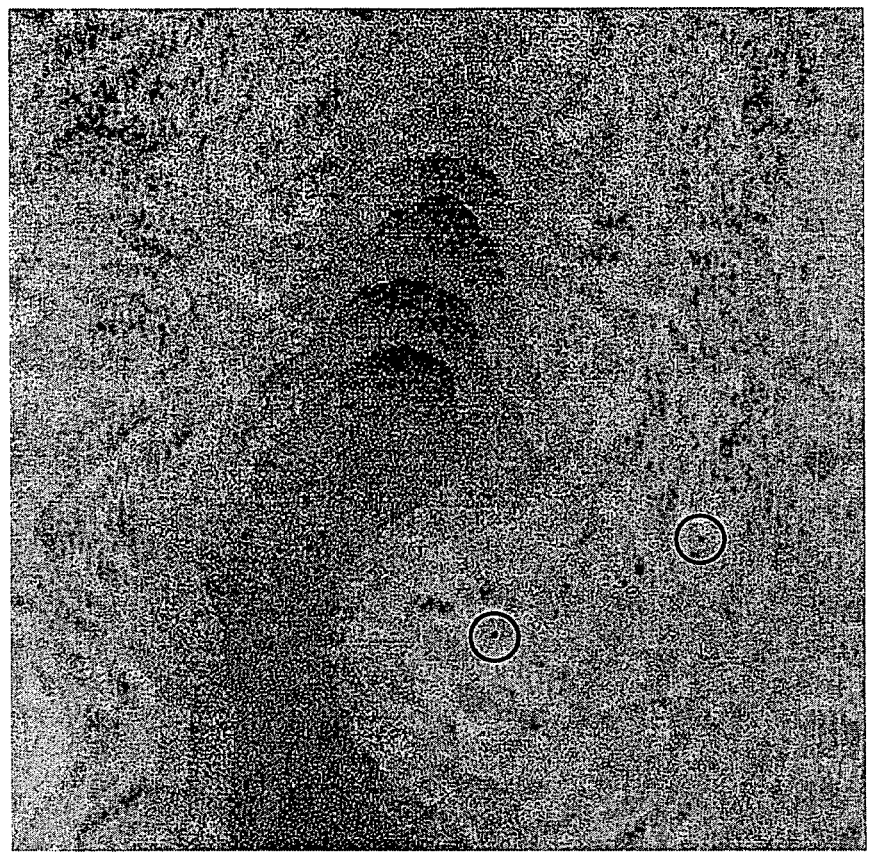

Having thus described the invention in general terms, reference will now be made to the accompanying drawings, which are not necessarily drawn to scale, and in which:

FIG. 1 is a cross-section of a semiconductor device structure in accordance with one embodiment of the present invention;

FIG. 2 is cross-section of another semiconductor device structure in accordance with additional embodiments of the present invention;

FIG. 3 is a cross-section of yet another semiconductor device structure in accordance with additional embodiments of the present invention;

FIG. 4 is a graph illustrating dislocation density of GaN layers with varying layer thicknesses;

FIG. 5 is a graph illustrating isolation voltage of GaN layers with varying layer thicknesses and transition metal dopant concentrations; and FIG. 6 is an AFM image of an exemplary semiconductor device structure in accordance with one embodiment of the invention.

DETAILED DESCRIPTION OF THE INVENTION

The present invention now will be described more fully hereinafter with reference to the accompanying drawings, in which some, but not all embodiments of the invention are shown. Indeed, this invention may be embodied in many different forms and should not be construed as limited to the embodiments set forth herein; rather, these embodiments are provided so that this disclosure will satisfy applicable legal requirements. Like numbers refer to like elements throughout the specification.

The terminology used herein is for the purpose of describing particular embodiments only and is not intended to be limiting of the invention. As used herein the term "and/or" includes any and all combinations of one or more of the associated listed items. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "above," "on" or extending "onto" another element, it can be directly above, directly on or extend directly onto the other element or intervening elements may also be present. In contrast, when an element is referred to as being "directly above," "directly on" or extending "directly onto" another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "above" or "upper" or "top" and "below" or "lower" or "bottom," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "upper" side of other elements and/or "above" other elements would then be oriented on "lower" sides of the other elements and/or "below" the other elements. The exemplary term "above" can therefore encompass both an orientation of "above" and "below," depending of the particular orientation of the figure. Similarly, if the device in one of the figures is turned over, elements described as "below" or "beneath" other elements would then be oriented "above" the other elements. The exemplary terms "below" or "beneath" can, therefore, also encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

FIG. 1 illustrates one embodiment of a Group III nitride semiconductor device substrate 10 of the invention including a Group III nitride epitaxial layer 14 above a silicon carbide substrate 12. The Group III nitride epitaxial layer 14 can be a semi-insulating layer, as discussed in more detail below. The SiC substrate 12 and the Group III nitride epitaxial layer 14 can provide a device substrate 10 (which can also be referred to as a "precursor" structure) on which a Group III nitride based semiconductor device structure, such as a HEMT, indicated generally at 16 in FIG. 1, can be fabricated.

As used herein, the term "Group III nitride" refers to those semiconductor compounds formed between nitrogen and the elements of Group III of the Periodic Table, usually aluminum (Al), gallium (Ga) and/or indium (In). The term also refers to ternary and quaternary compounds such as AlGaN and AlInGaN. As is well understood in the art, the Group III elements can combine with nitrogen to form binary (e.g., GaN), ternary (e.g., AlGaN, AlInN) and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them. In certain embodiments of the present invention, the Group III nitride epitaxial layer 14 is a gallium nitride (GaN) layer, in which x in the above formula is about 0.

The Group III nitride epitaxial layer can exhibit physical and electrical properties that can render the structure 10 useful for the production of various devices, including HEMTs. In contrast to many prior semiconductor structures, the device 10 of the present invention can include a Group III nitride epitaxial layer 14 that can have the apparently contradictory properties of reduced dislocation density in combination with a relatively high isolation voltage. In particular embodiments of the invention, the Group III nitride epitaxial layer 14 can have a dislocation density of less than about $4 \times 10^8$ cm$^{-2}$ and/or an isolation voltage of at least about 50 V.

Dislocation density can be determined using standard techniques known in the art for evaluating the properties of a substrate layer. As a non-limiting example, in the present invention, dislocation density can be evaluated by analyzing multiple 2 μm×2 μm AFM scans of a wafer.

The isolation voltage refers to the voltage that provides a 1 mA/mm current for an ungated transistor structure on the epitaxial layer 14. Thus, for example, the isolation voltage of a structure may be measured by forming a HEMT structure on the epitaxial layer 14 with a 5 μm source to drain spacing and removing the gate from the structure. The region beneath the gate 1 μm from each of the source and drain is damaged, for example, by ion implantation, to destroy the channel region of the device. A voltage is then applied from the source to the drain and the current measured. The voltage at which 1 mA/mm of current flow is measured is referred to herein as the isolation voltage of the structure. Larger gaps would yield a higher isolation voltage for a given material.

In various embodiments of the invention, the Group III nitride epitaxial layer 14 can have a thickness sufficient to reduce the concentration of dislocation defects present in the layer. As a non-limiting example, the Group III nitride epitaxial layer 14 of the device of the invention can have a thickness sufficient to provide a dislocation density of less than or about $4 \times 10^8$ cm$^{-2}$. In other non-limiting examples, the Group III nitride epitaxial layer can have a thickness sufficient to provide a dislocation density of less than or about $3 \times 10^8$ cm$^{-2}$, less than or about $2 \times 10^8$ cm$^{-2}$, and less than or about $10^8$ cm$^{-2}$. Exemplary devices of the invention can include a Group III nitride epitaxial layer 14 having a thickness of at least about 5 microns, a thickness of at least about 6 microns, a thickness of at least about 8 microns, a thickness of at least about 10 microns, and even a thickness of at least about 20 microns, and higher. FIG. 4 graphically illustrates that increasing GaN layer thickness can decrease dislocation density. FIG. 6 is a 2 μm×2 μm AFM image of an exemplary semiconductor device structure in accordance with one embodiment of the invention, and in particular, of a 7 μm thick iron doped GaN buffer. Multiple AFM scans are averaged to determine an average dislocation density of about $2 \times 10^8$ cm$^{-2}$.

Despite the relative thickness of the epitaxial layer, the Group III nitride epitaxial layer 14 can also have electrical properties suitable for use in a variety of applications. For example, the Group III nitride epitaxial layer 14 of the invention can have an isolation voltage sufficient to allow its use in the fabrication of transistors such as HEMTs. The Group III nitride epitaxial layer 14 can, for example, have an isolation voltage of at least about 50 V, at least about 100 V, and at least about 150 V, and higher.

The Group III nitride epitaxial layer 14 can include a deep level dopant, such as a deep level transition metal dopant, in an amount sufficient to increase the isolation voltage of the Group III nitride epitaxial layer to a level comparable to a Group III nitride epitaxial layer of the same thickness but without the deep level dopant. In certain embodiments of the invention, the Group III nitride epitaxial layer 14 can include a transition metal dopant in an amount sufficient to impart an isolation voltage thereto of at least about 50 V, and in some applications an isolation voltage of at least about 100 V, and even at least about 150 V, and higher. Exemplary concentrations of transition metal dopants can range from about $2 \times 10^{16}$ cm$^{-3}$ to about $2 \times 10^{18}$ cm$^{-3}$, although the present invention can include dopant concentrations outside of this range. FIG. 5 graphically illustrates that relatively thick GaN layers can exhibit improved isolation voltage with the addition of varying concentrations of iron dopant. The Group III nitride epitaxial layer 14 can further include a co-dopant, such as a shallow level dopant, which can be an n-type dopant or a p-type dopant. As non-limiting examples, the shallow level dopant can be Si, Ge, O, Mg or Zn and/or other p-type or n-type dopants. The shallow level dopant can be present at a concentration of less than about $1 \times 10^{17}$ cm$^{-3}$. A shallow level dopant can be incorporated in accordance with methods described in commonly assigned U.S. Pat. No. 7,135,715, titled "CO-DOPING FOR FERMI LEVEL CONTROL IN SEMI-INSULATING GROUP III NITRIDES," the entire disclosure of which is incorporated by reference in its entirety.

The incorporation of a deep level dopant, such as transition metal dopants, can make the Group III nitride epitaxial layer 14 insulating or semi-insulating. Exemplary transition metal dopants include without limitation iron (Fe), cobalt (Co), manganese (Mn), chromium (Cr), vanadium (V) and/or nickel (Ni), and mixtures thereof.

The concentration of the transition metal dopant can vary throughout the Group III nitride epitaxial layer 14. For example, the transition metal dopant can be introduced into the layer 14 to create a dopant concentration gradient that varies from a lower region of the layer 14 above the substrate 12 to an upper region of the layer 14 below the device structure 16 (for example, an upper region adjacent a 2DEG layer 26 of FIG. 2, described in more detail below). In exemplary embodiments of the invention, the transition metal dopant concentration can decrease from a maximum concentration in a lower region of the layer 14 above the substrate 12 to a minimum concentration in an upper region of the layer 14 below the device structure 16.

The concentration of the transition metal dopant within different regions of the layer 14 can be selected to impart the desired electrical and/or structural properties to the layer. For example, in non-limiting embodiments of the invention, the concentration of the transition metal dopant in a lower region of the layer 14 above the substrate 12 can be selected to minimize structural defects (for example, the dopant concentration can be greater than or about $2\times10^{18}$, but not so high that structural defects are created in the layer). Similarly, the concentration of the transition metal dopant in an upper region of the layer 14 can be selected to minimize trapping effects (for example, the dopant concentration can be less than or about $1\times10^{16}$). In addition, the transition metal doping can cease some distance from the upper surface of the layer 14, for example, cease some distance prior to the interface of layer 14 and device structure 16, which distance can also be selected to minimize and/or prevent trapping effects (for example about 1 µm from the 2DEG layer 26). The doping profile can be gradual so that there can be some tailing of the transition metal dopant into an undoped region of the layer 14. As a non-limiting example, the transition metal dopant concentration can decrease by a factor of about 10 approximately every 0.4 µm.

Turning again to FIG. 1, the silicon carbide substrate 12 can be a single crystal SiC substrate. The SiC substrate 12 can also have a polytype selected from the 3C, 4H, 6H, and 15R polytypes of silicon carbide. Silicon carbide has a very high thermal conductivity so that the total output power of Group III nitride devices on silicon carbide is typically not as limited by thermal dissipation of the substrate as can be the case of the same device formed on a different substrate, such as sapphire.

Silicon carbide substrates suitable for use in the present invention are commercially available and include, for example, silicon carbide substrates manufactured by Cree, Inc. of Durham, N.C., the assignee of the present invention. Methods of producing suitable silicon carbide substrates are known in the art and are described, for example, in U.S. Pat. No. Re 34,861; U.S. Pat. Nos. 4,946,547; 5,200,022; and 6,218,680, the contents of which are incorporated herein by reference in their entirety.

The diameter of the silicon carbide substrate can vary depending upon the requirements of particular application and can be 3 inches or more in diameter. The present invention can also include silicon carbide substrates that are at least 100 millimeters in diameter.

The Group III nitride epitaxial layer 14 can be formed on the substrate 12 by techniques known to those of skill in the art, with certain variations as set forth below. The general aspects of various vapor deposition techniques for the epitaxial growth of Group III nitrides, including gallium nitride, have been generally well established for a number of years. Furthermore, those familiar with the growth of crystals, particularly in difficult material systems such as gallium nitride, will recognize that the details of a given technique can and will vary, usually purposefully, depending upon the relevant circumstances. In addition, modifications to the present invention will be understood by those of ordinary skill in the art upon reading the description herein. Accordingly, descriptions given herein are most appropriately given in a general and schematic sense with the recognition that those persons of skill in this art will be able to carry out the invention based on the disclosures herein without undue experimentation. Exemplary techniques for epitaxial growth of Group III nitrides are described in, for example, U.S. Pat. Nos. 5,210,051; 5,393,993; 5,523,589; and 5,292,501, the contents of which are also incorporated herein by reference in their entirety. Generally, the substrate 12 is not patterned prior to deposition of the epitaxial layer.

As a non-limiting example, the epitaxial layer 14 can be formed on the substrate 12 using metal organic vapor phase epitaxy (MOVPE). Other suitable fabrication techniques, however, can also be useful in the present invention, including without limitation molecular beam epitaxy (MBE), vapor phase epitaxy (VPE) and the like. Suitable source (or precursor) materials for the epitaxial layer 14 can include Group III metal trialkyl compounds as known in the art, for example, trimethyl gallium, triethyl gallium, trimethyl aluminum, trimethyl indium, and the like, and mixtures thereof, for the Group III elements. Group V hydrides such as ammonia are suitable source materials for the nitrogen component.

The transition metal dopant can be incorporated into the Group III nitride epitaxial layer by introducing a transition metal dopant source (or precursor) material(s), typically in vapor form, into a reactor chamber under conditions suitable for the epitaxial growth of a Group III nitride epitaxial layer. The transition metal dopant source material can be introduced before, after or concurrently with the introduction of the Group III nitride source materials. A co-dopant, such as a shallow level dopant, can also be incorporated into the Group III nitride epitaxial layer, as discussed above. Reference is again made to commonly assigned U.S. Pat. No. 7,135,715.

In certain embodiments of the invention, the transition metal dopant is iron. Exemplary iron dopant source materials include, without limitation, ferrocene and/or iron pentacarbonyl based dopant precursors and mixtures thereof. Iron pentacarbonyl based dopant precursors useful in the invention include butadiene iron tricarbonyl, cyclooctatetraene iron tricarbonyl, 1,3-pentadiene iron tricarbonyl, iron pentacarbonyl, cyclohexadiene iron tricarbonyl, cycloheptadiene iron tricarbonyl, cycloheptatriene iron tricarbonyl, cyclopentadienyl iron dicarbonyl dimer, and methylcyclopentadienyl iron dicarbonyl dimmer, and mixtures thereof. Ferrocenes based dopant precursors useful in the present invention include for example ferrocene bis(cyclopentadienyl)iron or $Cp_2Fe$), dimethyl ferrocene, vinyl ferrocene, and butyl ferrocene, and mixtures thereof. Other exemplary transition metal dopant precursors include without limitation chromyl chloride, alkylmagnesium compounds such as dimethylmagnesium and diethylmagnesium, biscyclopentadienylmagnesium ($Cp_2Mg$), bismethylcyclopentadienylmagnesium (($CH_3)_2Cp_2Mg$), adducts of magnesium compounds, and mixtures thereof.

Conventional techniques can be utilized to introduce the dopant precursor. For example, for ferrocene, which is a solid at room temperature, a gas flow such as a hydrogen gas flow can pass over the ferrocene to induce sublimation. For precursors such as iron pentacarbonyl, a gas flow, such as a hydrogen gas flow, can be first introduced into a gas flow control means such as an electronic mass flow controller or needle valve that is adjusted to yield the desired iron concentration and then passed over an effusion source containing the precursor, e.g., iron pentacarbonyl.

As will be appreciated by the skilled artisan, the difference in unstrained lattice constants between the SiC substrate 12 and the Group III nitride epitaxial layer 14 can result in strain in the layer 14. Stress/strain can also result from differences in thermal expansion coefficients of the layer and substrate, from island growth and coalescence, etc. If the level of strain exceeds a certain threshold, particularly as the thickness of the layer increases, the layer 14 can crack and/or bow, which can render the layer unacceptable for many applications. Accordingly in the present invention, fabrication of the Group III nitride layer 14 can be controlled to control the strain in the layer. For example, the V/III composition and/or the pressure under which the Group III nitride epitaxial layer 14 is fabricated may be controlled to control the strain in the Group III nitride epitaxial layer 14. By increasing the V/III ratio, the Group III nitride epitaxial layer 14 may be made more compressive and/or less tensile. Furthermore, by fabricating the Group III nitride epitaxial layer 14 at lower pressures the layer 14 may be more compressive and/or less tensile. Accordingly, the thickness, growth conditions and source materials may be controlled to avoid changes in the strain of the epitaxial layer 14 during fabrication.

In addition, the device can be fabricated using techniques known in the art for strain management, including methods described in commonly assigned U.S. Pat. No. 6,841,001 and U.S. Pat. No. 7,030,428, the entire disclosure of which is incorporated by reference in their entirety. Accordingly, in certain embodiments of the invention, the semiconductor device structure can further include one or more strain management and/or variable mismatch layer(s), such as described in the foregoing patent and published application.

FIG. 2 illustrates a further embodiment of the present invention in which the Group III nitride device structure 16 includes a heterostructure 20 as a part of the semiconductor device structure 10 of FIG. 1. The heterostructure 20 of FIG. 2 can include a second, different composition Group III nitride epitaxial layer 22 on the first Group III nitride layer 14. Optionally, a third Group III nitride epitaxial layer 24, which can also differ compositionally from layer 14 and/or layer 22, can be present on the second Group III nitride epitaxial layer 22.

The compositions of the epitaxial layers 14 and 22, which can form the heterostructure 20, have compositions sufficiently different from one another to generate a two dimensional electron gas (2DEG) at the interface between the first and second Group III nitride epitaxial layers. This gas is schematically illustrated at 26, but it will be understood that FIG. 2 is not drawn to scale and that the 2DEG does not form a physical layer in the same sense as the epitaxial layers 14 and 22. The third Group III nitride epitaxial layer 24 can optionally be on the second Group III nitride epitaxial layer 22 to increase the electron mobility in the two dimensional electron gas.

The Group III nitride epitaxial layer 14 can be gallium nitride, and the second Group III nitride epitaxial layer 22 can include aluminum gallium nitride, i.e., $Al_xGa_{1-x}N$, wherein $0 \leq x \leq 1$. Those familiar with gallium nitride and aluminum gallium nitride will recognize that if x=1 and/or x≈1, the Group III nitride epitaxial layer 22 will substantially comprise aluminum nitride, i.e., AlN. In these exemplary embodiments, the Group III nitride epitaxial layer 24 can similarly comprise aluminum gallium nitride but have a different atomic fraction (i.e., "x") of aluminum (and therefore of gallium; "1-x") from the Group III nitride layer 22. As a non-limiting example, in these exemplary embodiments, the composition of the Group III nitride epitaxial layer 24 can be $Al_xGa_{1-x}N$, wherein $0 \leq x \leq 0.5$, although the composition can be varied, with x being between 0 and 1. In such a structure, the compositional differences between the heterostructure layers (e.g. a GaN layer 14 and an AlGaN layer 22) are sufficient to induce the 2DEG.

A semiconductor device such as illustrated in FIG. 2 can further include a nucleation layer 30 on the SiC substrate 12. The nucleation layer 30 can provide an appropriate growth transition between the SiC substrate 12 and the remainder of the structure. The nucleation layer 30 can be formed of various suitable semiconductor materials, including without limitation aluminum gallium nitride (AlGaN) and aluminum nitride (AlN).

The semiconductor device of the invention can further include a variable mismatch layer 32, disposed between the substrate 12, which has a first in-plane unstrained lattice constant, and the Group III nitride epitaxial layer 14, which has a second in-plane unstrained lattice constant that is different from the first in-plane unstrained lattice constant of the SiC substrate. In this embodiment of the invention, the variable mismatch layer is configured to reduce stress in the Group III nitride epitaxial layer 14 to below a level of stress resulting from growth of the Group III nitride layer 14 on the SiC substrate 12. For example, in certain embodiments, the variable mismatch layer 32 can have an third in-plane unstrained lattice constant that is mismatched with the first in-plane unstrained lattice constant of the SiC substrate 12 but is substantially matched to the second in-plane unstrained lattice constant of the Group III nitride epitaxial layer 14. Reference is again made to commonly assigned U.S. Pat. No. 6,841,001 and U.S. Pat. No. 7,030,428.

The present invention is not limited to the device of FIG. 2 having the heterostructure 20 as illustrated, and modifications to the illustrated embodiment will be understood by those of ordinary skill in the art upon reading the description herein. Accordingly, the precursor device structure 10, including the SiC substrate and the first Group III nitride epitaxial layer 14, can be useful in a variety of other semiconductor device structures. As another non-limiting example, the structure 10 can be useful in the fabrication of a device including an InGaN channel layer on the Group III nitride epitaxial layer 14, and further including a GaN cap on the InGaN channel layer and a AlGaN/AlN barrier layer on the GaN cap.

FIG. 3 is a schematic diagram of a semiconductor structure broadly designated at 40 that includes a high electron mobility transistor (HEMT) type structure. The structure includes a SiC substrate 12 (which can be semi-insulating as known in the art) and a Group III nitride layer 14, such as a GaN layer, on the SiC substrate 12, optionally with a nucleation layer 30 and/or a strain management layer 32 disposed therebetween. The Group III nitride epitaxial layer 14 can be part of a Group III heterostructure 20, which can further include at least two additional Group III nitride epitaxial layers 22 and 24. Generally the composition of layers 14 and 22 is sufficiently different to generate a two dimensional electron gas 26 at their interface. A plurality of respective source 42, drain 46, and gate 44 contacts are in conductive relationship to the heterostructure 20. FIG. 3 shows one set of source 42, drain 46, and gate contacts 44, but it will be understood by those familiar with semiconductor manufacturing that a wafer can include a large plurality, perhaps several hundred, of such contacts defining a similarly large plurality of HEMT precursor structures on the wafer.

The steps of isolating and separating such devices from one another are generally well understood in this art and will not be repeated in detail herein. Reference is also made to transistor structures such as those described in commonly assigned U.S. Pat. Nos. 6,316,793 and 6,548,333, for "ALU- MINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," U.S. Pat. No. 6,849,882 to Smorchkova et al., entitled "GROUP-III NITRIDE BASED HIGH ELECTRON MOBILITY TRANSISTOR (HEMT) WITH BARRIER/SPACER LAYER", U.S. Pat. No. 6,982,204 for "NITRIDE-BASED TRANSISTORS AND METHODS OF FABRICATION THEREOF USING NON-ETCHED CONTACT RECESSES," U.S. Pat. No. 7,170,111 for "NITRIDE HETEROJUNCTION TRANSISTORS HAVING CHARGE-TRANSFER INDUCED ENERGY BARRIERS AND METHODS OF FABRICATING THE SAME," U.S. Pat. No. 7,238,560 entitled "METHODS OF FABRICATING NITRIDE-BASED TRANSISTORS WITH A CAP LAYER AND A RECESSED GATE," U.S. Pat. No. 7,432,142 entitled "METHODS OF FABRICATING NITRIDE-BASED TRANSISTORS HAVING REGROWN OHMIC CONTACT REGIONS AND NITRIDE-BASED TRANSISTORS HAVING REGROWN OHMIC CONTACT REGIONS," U.S. Pat. No. 7,084,441 entitled "SEMICONDUCTOR DEVICES HAVING A HYBRID CHANNEL LAYER, CURRENT APERTURE TRANSISTORS AND METHODS OF FABRICATING SAME," U.S. Pat. No. 7,230,284 for "INSULATING GATE ALGAN/GAN HEMT", and U.S. Pat. No. 7,456,443 entitled "CAP LAYERS AND/OR PASSIVATION LAYERS FOR NITRIDE-BASED TRANSISTORS, TRANSISTOR STRUCTURES AND METHODS OF FABRICATING SAME," the disclosures of which are incorporated herein as if described in their entirety. Embodiments of the present invention may also be utilized with HEMT structures such as described in, for example, Yu et al., "Schottky barrier engineering in III-V nitrides via the piezoelectric effect," Applied Physics Letters, Vol. 73, No. 13, 1998, or in U.S. Pat. No. 6,548,333 filed Jul. 12, 2001, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," the disclosures of which are incorporated herein by reference as if set forth fully herein.

In the drawings and specification there has been set forth a preferred embodiment of the invention, and although specific terms have been employed, they are used in a generic and descriptive sense only and not for purposes of limitation, the scope of the invention being defined in the claims.

That which is claimed is:

1. A semiconductor device structure, comprising:
    a silicon carbide substrate; and
    a gallium nitride (GaN) layer having a first surface adjacent the silicon carbide substrate and a second surface opposite the first surface above the silicon carbide substrate having a dislocation density that is less than about $4 \times 10^8$ cm$^{-2}$ and an isolation voltage in a range between about 50 V and about 150V, wherein the GaN layer includes a transition metal dopant in a concentration range between about $2 \times 10^{16}$ cm$^{-3}$ and $2 \times 10^{18}$ cm$^{-3}$ that decreases within this range from the first surface towards the second surface by a factor of about 10 approximately every 0.4 μm in the GaN layer and has a thickness in a range between about 5 microns and about 20 microns.

2. The semiconductor device structure of claim 1, wherein the dislocation density of the GaN layer is less than about $3 \times 10^8$ cm$^{-2}$.

3. The semiconductor device structure of claim 1, wherein the dislocation density of the GaN layer is less than about $2 \times 10^8$ cm$^{-2}$.

4. The semiconductor device structure of claim 1, wherein the transition metal dopant is selected from a group consisting of Fe, Co, Mn, Cr, V, Cu and Ni and mixtures thereof.

5. The semiconductor device structure of claim 1, wherein the transition metal dopant comprises Fe.

6. The semiconductor device structure of claim 1, wherein the semiconductor device structure comprises a device wafer having a diameter of at least about 3 inches.

7. The semiconductor device structure of claim 1, wherein the semiconductor device structure comprises a device wafer having a diameter of at least about 100 millimeters.

8. The semiconductor device structure of claim 1, further comprising at least one nucleation layer disposed between the silicon carbide substrate and the GaN layer.

9. The semiconductor device structure of claim 8, wherein the at least one nucleation layer is selected from a group consisting of aluminum gallium nitride (AlGaN) layers and aluminum nitride (AlN) layers.

10. The semiconductor device structure of claim 8, further comprising a Group III nitride epitaxial layer on the GaN layer having a composition sufficiently different from the GaN layer to generate a two dimensional electron gas at an interface between the GaN layer and the Group III nitride epitaxial layer.

11. The semiconductor device structure of claim 10, wherein the two dimensional electron gas has an electron mobility and wherein the semiconductor device structure further comprises at least a second Group III nitride epitaxial layer above the Group III nitride epitaxial layer for increasing the electron mobility in the two dimensional electron gas.

12. The semiconductor device structure of claim 11, wherein the Group III nitride epitaxial layer comprises $Al_xGa_{1-x}N$, wherein $0 \leq x \leq 1$, and the second Group III nitride epitaxial layer comprises aluminum gallium nitride having different atomic fractions of aluminum and gallium from the Group III nitride epitaxial layer.

13. The semiconductor device structure of claim 11, further comprising at least one strain management layer disposed between the silicon carbide substrate and the GaN layer having an associated strain which minimizes cracking of the GaN layer.

14. The semiconductor device structure of claim 1, wherein the silicon carbide substrate comprises a polytype selected from 3C, 4H, 6H and 15R polytypes of silicon carbide.

15. The semiconductor device structure of claim 1, wherein the silicon carbide substrate is not patterned.

16. The semiconductor device structure of claim 1, wherein the isolation voltage of said GaN layer is at least about 50V at 1 mA per mm of current flow.

17. The semiconductor device structure of claim 1, wherein the isolation voltage of said GaN layer is measured over a distance of 5 μm.

18. The semiconductor device structure of claim 1, wherein the concentration range of the transition metal dopant decreases from about $2 \times 10^{18}$ cm$^{-3}$ at the first surface to about $2 \times 10^{16}$ cm$^{-3}$ towards the second surface.

19. The semiconductor device structure of claim 1, wherein the GaN layer has a dislocation density greater than about $10^8$ cm$^{-2}$.

20. A semiconductor device structure, comprising:
    a silicon carbide substrate;
    a Group III nitride heterostructure over the silicon carbide substrate comprising a gallium nitride (GaN) layer over the silicon carbide substrate having a first surface adjacent the silicon carbide substrate and a second surface opposite the first surface wherein the GaN layer has an isolation voltage in a range between about 50V and about 150V, and a Group III nitride epitaxial layer over the GaN layer that is sufficiently different in composition from the GaN layer to generate a two dimensional electron gas at their interface, wherein the GaN layer includes a transition metal dopant in a concentration range between about $2\times10^{16}$ cm$^{-3}$ and $2\times10^{18}$ cm$^{-3}$ that decreases within this range from the first surface towards the second surface by a factor of about 10 approximately every 0.4 µm in the GaN layer and a thickness in a range between about 5 microns and about 20 microns; and a plurality of respective source, drain and gate contacts in conductive relationship to the Group III nitride hetero structure.

21. The semiconductor device structure of claim 20, wherein the GaN layer has a dislocation density in a range between about $10^8$ cm$^{-2}$ and about $4\times10^8$ cm$^{-2}$.

22. The semiconductor device structure of claim 21, wherein the dislocation density of the GaN layer is less than about $3\times10^8$ cm$^{-2}$.

23. The semiconductor device structure of claim 21, wherein the dislocation density of the GaN layer is less than about $2\times10^8$ cm$^{-2}$.

24. The semiconductor device structure of claim 21, wherein the transition metal dopant is selected from a group consisting of Fe, Co, Mn, Cr, V, Cu and Ni and mixtures thereof.

25. The semiconductor device structure of claim 21, wherein the transition metal dopant comprises Fe.

26. The semiconductor device structure of claim 20, wherein the semiconductor device structure comprises a device wafer having a diameter of at least about 3 inches.

27. The semiconductor device structure of claim 20, wherein the semiconductor device structure comprises a device wafer having a diameter of at least about 100 millimeters.

28. The semiconductor device structure of claim 20, further comprising at least one nucleation layer disposed between the substrate and the GaN layer.

29. The semiconductor device structure of claim 28, wherein the at least one nucleation layer is selected from a group consisting of aluminum gallium nitride (AlGaN) layers and aluminum nitride (AlN) layers.

30. The semiconductor device structure of claim 20, wherein the two dimensional electron gas has an electron mobility and wherein the semiconductor device structure further comprises a further Group III nitride epitaxial layer above the GaN layer for increasing the electron mobility in the two dimensional electron gas.

31. The semiconductor device structure of claim 30, wherein the Group III nitride epitaxial layer comprises Al such that the Group III nitride epitaxial layer comprises $Al_xGa_{1-x}N$, wherein $0<x\leq1$, and the further Group III nitride epitaxial layer comprises aluminum gallium nitride having different atomic fractions of aluminum and gallium from the Group III nitride epitaxial layer.

32. The semiconductor device structure of claim 20, further comprising at least one strain management layer disposed between the substrate and the GaN layer having an associated strain which minimizes cracking of the GaN layer.

33. The semiconductor device structure of claim 20, wherein the silicon carbide substrate comprises a polytype selected from 3C, 4H, 6H and 15R polytypes of silicon carbide.

34. The semiconductor device structure of claim 20, wherein the silicon carbide substrate is not patterned.

35. The semiconductor device structure of claim 20, wherein the concentration range of the transition metal dopant decreases from about $2\times10^{18}$ cm$^{-3}$ at the first surface to about $2\times10^{16}$ cm$^{-3}$ towards the second surface.

36. The semiconductor device structure of claim 20, wherein the GaN layer has a dislocation density greater than about $10^8$ cm$^{-2}$.

37. A method of fabricating a Group III nitride semiconductor device structure, comprising:

providing silicon carbide substrate;

forming a gallium nitride (GaN) layer on the silicon carbide substrate, the GaN layer having a first surface adjacent the silicon carbide substrate and a second surface opposite the first surface above the silicon carbide substrate having a dislocation density that is less than about $4\times10^8$ cm$^{-2}$ and an isolation voltage in a range between about 50V and about 150V, wherein the GaN layer includes a transition metal dopant in a concentration range between about $2\times10^{16}$ cm$^{-3}$ and $2\times10^{18}$ cm$^{-3}$ that decreases within this range from the first surface towards the second surface by a factor of about 10 approximately every 0.4 µm in the GaN layer and a thickness in a range between about 5 microns and about 20 microns.

38. The method of claim 37, wherein the forming step comprises introducing gaseous Group III nitride precursors and a transition metal dopant in an amount sufficient to increase the isolation voltage of the GaN layer as compared to a GaN layer of the same thickness without a transition metal dopant into a reactor chamber under a condition suitable for epitaxial growth of the GaN layer.

39. The method of claim 38, wherein the step of introducing gaseous Group III nitride precursors comprises introducing gaseous gallium nitride (GaN) precursors.

40. The method of claim 39, wherein the gaseous GaN precursors comprise gallium trialkyls and ammonia.

41. The method of claim 38, wherein the step of introducing a transition metal dopant comprises introducing at least one transition metal selected from the group consisting of Fe, Co, Mn, Cr, V, Cu and Ni and mixtures thereof.

42. The method of claim 41, wherein the transition metal dopant comprises Fe.

43. The method of claim 37, further comprising forming at least one nucleation layer between the silicon carbide substrate and the GaN layer.

44. The method of claim 37, wherein the method further comprises forming a heterostructure comprising the GaN layer and a Group III nitride epitaxial layer on the GaN layer having a composition sufficiently different from the GaN layer to generate a two dimensional electron gas at an interface between the GaN layer and the Group III nitride epitaxial layer.

45. The method of claim 44, further comprising forming at least a second Group III nitride epitaxial layer above the Group III nitride epitaxial layer for increasing electron mobility in the two dimensional electron gas.

46. The method of claim 45, wherein the Group III nitride epitaxial layer comprises $Al_xGa_{1-x}N$, wherein $0<x\leq1$, and the second Group III nitride epitaxial layer comprises aluminum gallium nitride having different atomic fractions of aluminum and gallium from the Group III nitride epitaxial layer.

47. The method of claim 37, further comprising forming at least one strain management layer between the SiC substrate and the GaN layer having an associated strain selected to minimize cracking of the GaN layer.

48. The method of claim 44, further comprising forming a plurality of gate, source and drain contacts in conductive relationship to the heterostructure.

49. The method of claim 37, wherein the forming step comprises forming the GaN layer on an unpatterned silicon carbide substrate.

50. The method of claim 37, wherein the forming step comprises introducing gaseous Group III nitride precursors into a reactor chamber under a condition suitable for epitaxial growth of the GaN layer.

51. The method of claim 50, wherein the step of introducing gaseous Group III nitride precursors comprises introducing gaseous gallium nitride (GaN) precursors.

52. The method of claim 51, wherein the gaseous GaN precursors comprise gallium trialkyls and ammonia.

53. The method of claim 37, further comprising forming at least one nucleation layer between the SiC substrate and the GaN layer.

54. The method of claim 37, further comprising forming at least one strain management layer between the SiC substrate and the GaN layer having an associated strain selected to minimize cracking of the GaN layer.

55. The method of claim 37, wherein the forming step comprises forming the GaN layer on an unpatterned silicon carbide substrate.

56. The method of claim 37, wherein the concentration range of the transition metal dopant decreases from about $2\times10^{18}$ cm$^{-3}$ at the first surface to about $2\times10^{16}$ cm$^{-3}$ towards the second surface.

57. The method of claim 37, wherein the GaN layer has a dislocation density greater than about $10^8$ cm$^{-2}$.

\* \* \* \* \*